(12) United States Patent
Fischer et al.

(10) Patent No.: US 7,722,778 B2
(45) Date of Patent: May 25, 2010

(54) METHODS AND APPARATUS FOR SENSING UNCONFINEMENT IN A PLASMA PROCESSING CHAMBER

(75) Inventors: Andreas Fischer, Castro Valley, CA (US); David Pirkle, Soquel, CA (US)

(73) Assignee: Lam Research Corporation, Fremont, CA (US)

( * ) Notice: Subject to any disclaimer, the term of this patent is extended or adjusted under 35 U.S.C. 154(b) by 390 days.

(21) Appl. No.: 11/427,326

(22) Filed: Jun. 28, 2006

(65) Prior Publication Data
US 2010/0096361 A1  Apr. 22, 2010

(51) Int. Cl.
H01L 21/302 (2006.01)

(52) U.S. Cl. .............................. 216/59; 216/61; 216/67; 438/10; 438/17; 438/710; 156/345.24; 156/345.28; 118/702; 118/712

(58) Field of Classification Search ........................ None
See application file for complete search history.

(56) References Cited

U.S. PATENT DOCUMENTS

| | | | |
|---|---|---|---|
| 4,679,007 | A | 7/1987 | Reese et al. |
| 5,716,534 | A | 2/1998 | Tsuchiya et al. |
| 6,174,450 | B1 | 1/2001 | Patrick et al. |
| 6,178,919 | B1 * | 1/2001 | Li et al. ............... 118/723 E |
| 6,221,221 | B1 * | 4/2001 | Al-Shaikh et al. ...... 204/298.02 |
| 6,242,360 | B1 * | 6/2001 | Fischer et al. ................ 438/710 |
| 6,583,572 | B2 | 6/2003 | Veltrop et al. |
| 6,772,961 | B2 * | 8/2004 | Forbes Jones et al. ......... 239/79 |
| 6,792,889 | B2 * | 9/2004 | Nakano et al. ............ 118/723 E |
| 6,870,124 | B2 * | 3/2005 | Kumar et al. ........... 219/121.46 |
| 7,186,315 | B2 * | 3/2007 | Himori et al. ........... 156/345.47 |
| 2003/0151371 | A1 * | 8/2003 | Fischer et al. ........... 315/111.21 |
| 2003/0178140 | A1 * | 9/2003 | Hanazaki et al. ........ 156/345.28 |
| 2005/0022736 | A1 * | 2/2005 | Steger ......................... 118/715 |
| 2005/0099135 | A1 * | 5/2005 | Landis et al. ........... 315/111.41 |
| 2005/0103442 | A1 * | 5/2005 | Chen et al. .............. 156/345.47 |
| 2005/0178749 | A1 * | 8/2005 | Yamazaki et al. ....... 219/121.62 |
| 2006/0060302 | A1 * | 3/2006 | White et al. ............. 156/345.28 |
| 2006/0231029 | A1 * | 10/2006 | Blonigan et al. ............. 118/722 |
| 2007/0158027 | A1 * | 7/2007 | Aoki et al. .............. 156/345.43 |
| 2007/0284045 | A1 * | 12/2007 | Fischer et al. ........... 156/345.43 |
| 2008/0099448 | A1 * | 5/2008 | Larson et al. ........... 219/121.43 |
| 2008/0182417 | A1 * | 7/2008 | Collins et al. ................ 438/710 |
| 2009/0151871 | A1 * | 6/2009 | Pease et al. ............. 156/345.28 |

OTHER PUBLICATIONS

"Written Opinion", Issue in PCT Application No. PCT/US2007/72158; Mailing Date.: Feb. 28, 2008.
"International Search Report", Issue in PCT Application No. PCT/US2007/72158; Mailing Date.: Feb. 28, 2008.
"International Preliminary Report on Patentability", Issued in PCT Application No. PCT/US2007/072158; Mailing Date: Jan. 15, 2009.

* cited by examiner

Primary Examiner—Anita K Alanko
(74) Attorney, Agent, or Firm—IP Strategy Group, P.C.

(57) ABSTRACT

Universal plasma unconfinement detection systems configured to detect the plasma unconfinement condition in the plasma processing chamber and methods therefor. The detection systems and methods are designed to reliably and accurately detect the existence of the plasma unconfinement condition in a process-independent and recipe-independent manner.

22 Claims, 7 Drawing Sheets

METHODS AND APPARATUS FOR SENSING UNCONFINEMENT IN A PLASMA PROCESSING CHAMBER

BACKGROUND OF THE INVENTION

The present invention relates in general to substrate manufacturing technologies and in particular to processing technologies that use non-magnetically confined plasma. More specifically, the invention relates to methods and apparatuses for sensing the failure of sustaining confined plasma, called un-confinement, in a plasma processing chamber.

In the processing of a substrate, e.g., a semiconductor substrate or a glass panel such as one used in flat panel display manufacturing, plasma is often employed. As part of the processing of a substrate in a plasma chamber for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In general, plasma chambers may confine plasma through the use of non-magnetic methods (e.g., quartz confinement rings, etc.) in order to minimize chamber wall contact. This is beneficial for reducing contamination levels and memory effects. For example, many surfaces within the plasma chamber are configured with plasma resistant materials (e.g., silicon, silicon carbide, silicon nitride, quartz, etc.) that help to minimize surface wear without substantially increasing contaminants that may affect the substrate. However, continued exposure to plasma tends to attack and remove the protective material, often resulting in surface particle contamination and hence lower substrate yields.

Figure 1A:
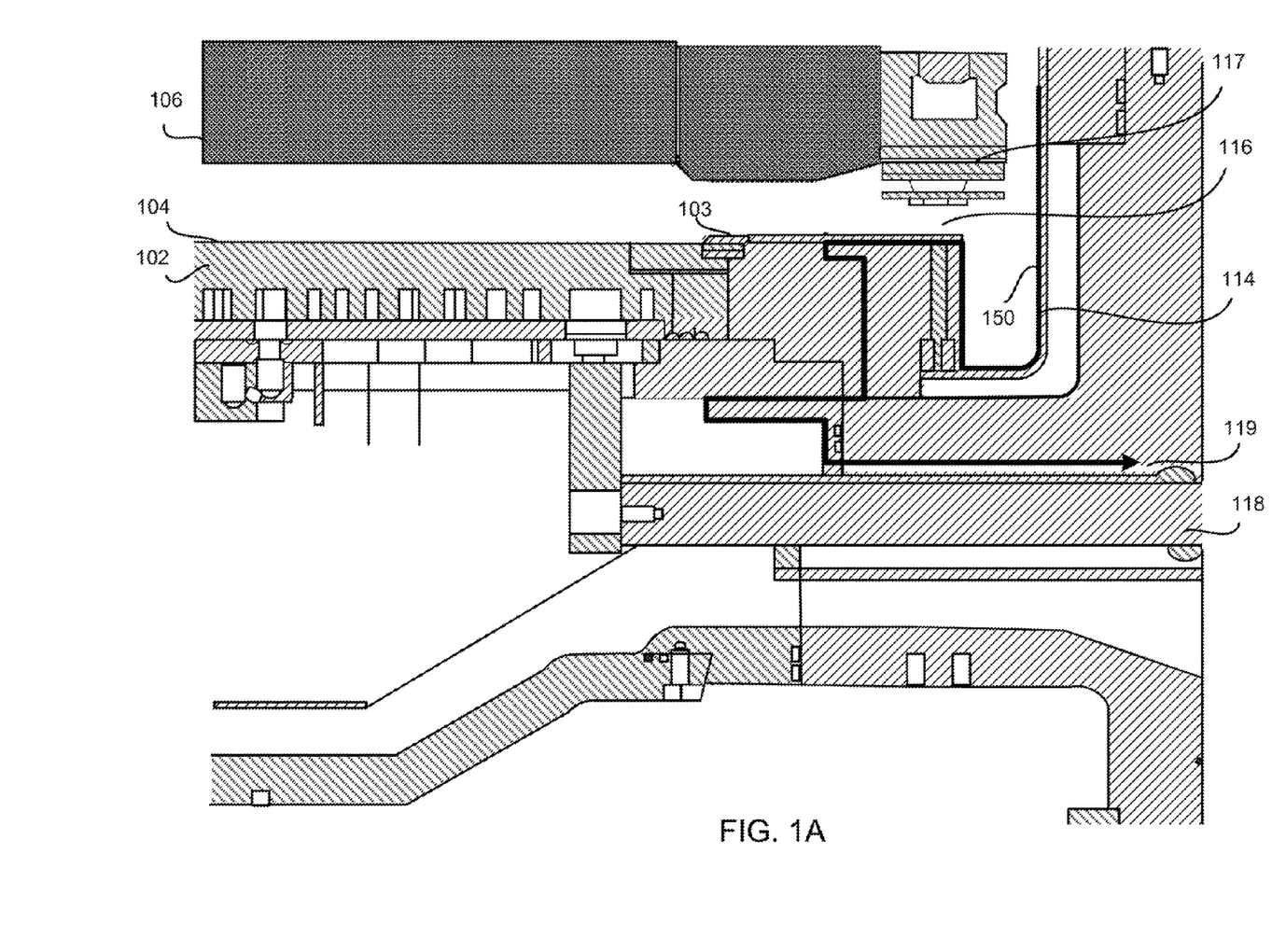
FIG. 1A is a representative and simplified drawing of a capacitively coupled plasma processing chamber, including a depiction of the return RF current in the confined state.
Figure 1B:
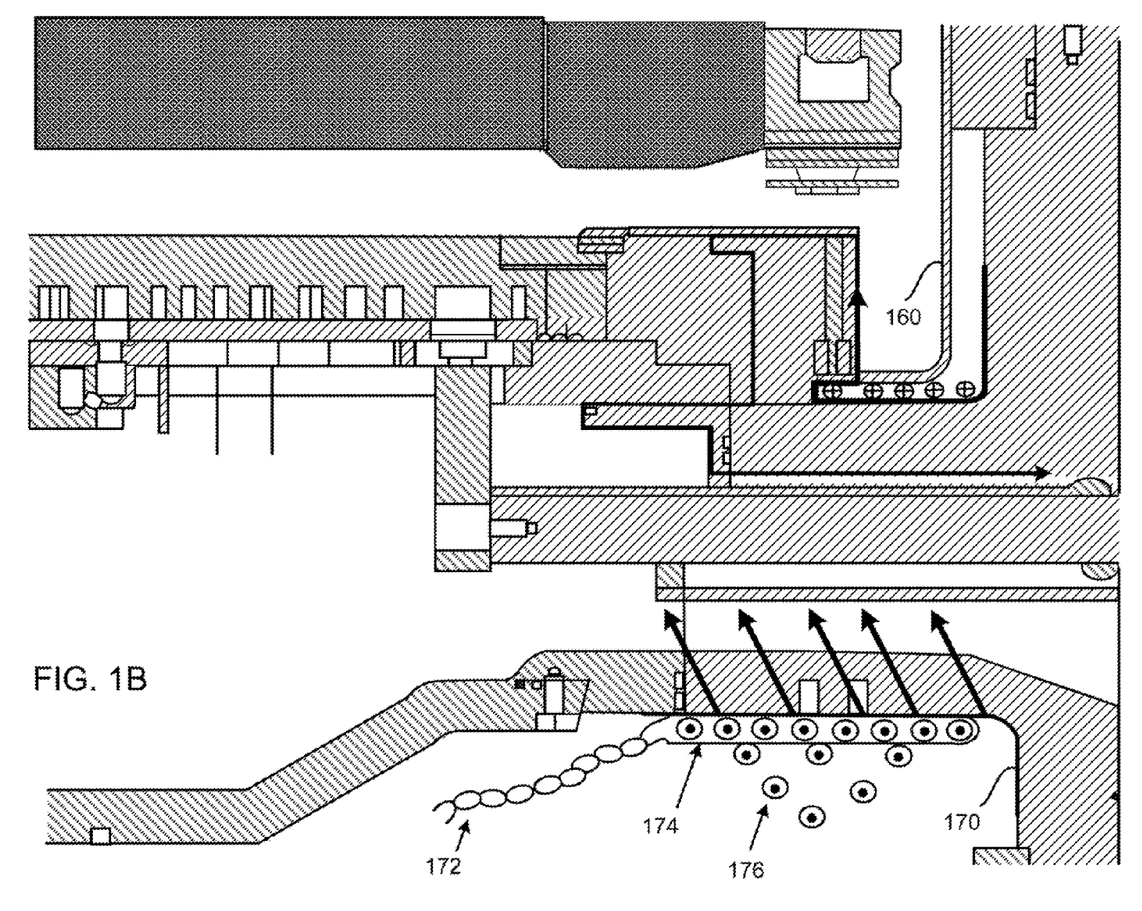
FIG. 1B is a representative and simplified drawing of the plasma processing chamber of FIG. 1A, including a depiction of the return RF current in the unconfined state.

Referring now to FIG. 1A, a simplified diagram of a capacitively coupled plasma (CCP) processing system is shown. FIG. 1A and its counterpart FIG. 1B are simplified in that many components that are irrelevant to the invention herein have been omitted to avoid unduly cluttering up the more relevant features. A typical CCP configuration commonly consists of two electrodes separated by a small distance, operating in a manner similar in principle to a capacitor in an electric circuit. Powered electrode 102 is typically configured as a chuck, and, further, may be coupled to a set of RF generators [not shown] by transmission line 118, positioned in transmission line bore 119.

Powered electrode 102 may further include a bias compensation circuit [not shown], including a set of positive poles and a set of negative poles configured to provide an electrostatic clamping force in order to clamp substrate 104 to chuck 102. For example, a set of positive and negative voltages of +300V and −300V respectively supplied to these poles may provide a sufficient electrostatic clamping force, in order to clamp substrate 104 to chuck 102. A bias compensation circuit helps maintain a consistent clamping force across the substrate during plasma processing by providing a bias compensation voltage ($V_b$).

A second grounded electrode 106 is typically placed above plasma 122. The RF return path generally follows a path in the upper part of the plasma chamber, from grounded electrode 106, through chamber liner 114, ground extension 116, and along the inner surface of the transmission line bore 119. Certain etch applications may require the upper electrode to be grounded with respect to the lower frequency RF signal (e.g., 2 MHz). Another etch application may require the upper electrode to be grounded with respect to the higher frequency RF signal (e.g., 27 MHz and/or 60 MHz). Still another etch application may require the upper electrode to be grounded with respect to all of the RF signal frequencies (e.g., 2 MHz, 27 MHz, and 60 MHz). Grounded electrode 106 further may include a protective layer of perforated silicon that allow plasma gases to pass through into the plasma chamber from a gas distribution system. Furthermore, a substrate 104 is commonly positioned with edge ring 103 on chuck/RF-powered electrode 102.

In general, the magnitude of $V_b$, the bias compensation voltage, is proportional to the ratio of the ground surface area (normally the grounded electrode) to the surface area of the substrate:

$$V_B = \left(\frac{\text{Ground\_Area}}{\text{Substrate\_Area}}\right)^N \quad \text{[Equation 1]}$$

where N is typically between 1 and 4.

In addition, a confinement ring set 117 may be positioned between the CCP source and the plasma chamber wall, and may further be raised and lowered as required to isolate plasma over the substrate surface. Typically, the confinement ring set 117 is configured as a series of quartz rings positioned around a horizontal perimeter of a substrate, and further positioned in varying distances above the substrate along the vertical axis. In general, the thickness of each confinement ring, as well as the size of the gap between any two rings, is configured in order to optimize the particular plasma process and control the pressure within the plasma. In some configurations, the confinement rings are of differing diameter and thickness. For example, a confinement ring positioned closer to a substrate along the vertical axis, may be smaller in diameter to one farther away from the substrate. In general, the volume defined by the confinement ring set, the substrate and the powered electrode may be referred to as the plasma space within the plasma processing system.

Current trends in the semiconductor industry to further reduce substrate feature sizes, as well as the implementation of new-substrate materials, has challenged current fabrication technologies. For example, it is becoming increasing difficult to maintain the uniformity or process results on larger substrates (e.g., >300 mm). In order to achieve substantially vertical etch profiles and high aspect ratios, higher process power and lower pressure may be required. Consequently, the resulting plasma may be challenging to confine. Should the plasma become unconfined, substantial damage may occur to both, the processed substrate, as well as the plasma chamber itself, as a result of a substantial uncontrolled increase in voltage.

To minimize un-confined plasma damage a bias voltage threshold is established which is proportional to the steady-state bias voltage at the wafer in the confined case. If the measured bias voltage at the wafer exceeds that threshold, RF is shut off and plasma is terminated immediately. This shut-off method is making use of the fact that $V_b$ significantly increases when the plasma is in the unconfined state due to the change in electrode area ratio. When unconfinement occurs, according to equation 1, the area of ground has increased from the area of electrode 106 in FIG. 1A to the area of the entire inside surface of the plasma reactor.

In existing art, however, it may be difficult to determine the correct threshold voltage since prior knowledge of the steady-state or safe $V_b$ value is required. In many cases, especially when new recipes are developed, an up-front estimate of this threshold may be very difficult, often leading to sensing of either "false positives" if a bias voltage threshold was set too low, or non-detection and hence plasma chamber damage if the bias voltage threshold was set too high.

In view of the foregoing, there are desired methods and apparatuses for sensing un-confinement in a plasma processing chamber.

SUMMARY OF THE INVENTION

The invention relates, in an embodiment, to a method for detecting a plasma unconfinement condition in a plasma processing chamber. The plasma unconfinement condition is characterized by the presence of plasma in excess of a pre-defined specification outside of a designed plasma confinement volume within the plasma processing chamber. The method includes providing a sensor in a selected position within the chamber. The selected position is disposed proximate a plasma processing chamber component that is configured to conduct a first level of a return RF current during plasma processing if the plasma is confined within the pre-defined specification within the designed plasma confinement volume and a second level of the return RF current during the plasma processing if the plasma is in excess of the pre-defined specification outside the designed plasma confinement volume during the plasma processing, wherein the sensor and the selected position are configured to provide an electrical parameter having discriminable variation between a first state and a second state, the first state being characteristic of the first level of the return RF current, the second state being characteristic of the second level of the return RF current. The method further includes providing a sensor data processing arrangement that is coupled to the sensor. The sensor data processing arrangement is configured to provide, responsive to the electrical parameter, a data signal signifying whether the plasma processing chamber is experiencing the plasma unconfinement condition.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described.

In embodiments of the invention, there exists a universal plasma unconfinement detection system (UPUDS) that is configured to detect the plasma unconfinement condition in the plasma processing chamber. Generally speaking, in substantially all plasma processing chambers, there exists a designed plasma confinement volume (DPCV) within which the plasma is supposed to be generated and/or sustained for substrate processing. For example, some plasma processing systems are designed such that the generated plasma is confined within the volume defined generally by the top electrode, the surrounding focus rings, and the bottom electrode (which may or may not include an edge ring). When plasma is confined within the designed plasma confinement volume (DPCV), the plasma is said to be in a confined state or in a confined condition. In this confined state, the plasma density within the plasma processing chamber but outside of this designed plasma confinement volume is very low or is substantially zero.

When the plasma becomes unconfined, the plasma density in various locations outside of the aforementioned designed plasma confinement volume exceeds a predefined specification (which, as mentioned, tends to be very low or substantially zero when the plasma is in the confined state). The unconfined state is undesirable due to the reasons already discussed above. Embodiments of the invention are configured to sense this unconfined state.

The inventors herein believe that in the confined state, the return RF current traverses certain established paths with respect to the chamber. A depiction of the return RF current path for the confined state is shown by reference number 150 in FIG. 1A. On the other hand, in the unconfined state, the increased presence of plasma outside of the designed plasma confinement volume (DPCV) creates additional and/or alternative return RF current paths. The return RF current paths for the unconfined state are depicted by reference numbers 160 and 170 in FIG. 1B. These unconfined state return RF current paths traverse chamber components that previously experience very low or substantially no return RF current flow. By detecting the presence of return RF current flows that are characteristic of the unconfined plasma condition through these chamber components, a reliable technique for detecting the occurrence of the plasma unconfinement state is thus realized.

Generally speaking, presence of return RF current flows that are characteristic of the unconfined plasma condition may be detected using sensors located at pre-selection sensor locations in the chamber. The location of the sensor is selected to be one that provides a discriminable variation in the sensor signal between the plasma confinement state and the plasma unconfinement state. The variation in the sensor signal is said to be "discriminable" if the signal processing circuitry can discriminate from the sensor signal whether the plasma is in the confined state or the unconfined state.

One skilled in the art of signal processing will readily appreciate that detection of states from a given sensor signal depends on one or both of the sensor sensitivity and the capability of the signal processing circuitry. Sensor sensitivity will generally depend on the appropriate selection of the sensor and/or the positioning of the sensor in the plasma processing chamber. For example, a highly sensitive sensor may not need to be positioned in the most optimal location to generate discriminable variations in the sensor signal. As another example, a less sensitive sensor may still generate discriminable variations in the sensor signal if the sensor location is well selected to allow the sensor to make the most of its sensing capability. As yet another example, deficiencies in the sensor capability and/or the sensor location may be remedied by intelligent signal processing algorithms capable of accurately ascertaining whether the plasma is in the confined state or the unconfined state from less-than-optimal sensor signal. Accordingly, it is the intention of the inventors herein that although some sensors and sensor locations are more preferable than others, specific sensors and/or sensor locations depicted in the examples herein are not limiting of the scope of the invention.

In an embodiment, a pickup coil is disposed in a non-contacting, proximate relationship with respect to a chamber component that normally experiences very little or substantially zero return RF current flow in the confined state. It is preferable (but not absolutely required) that the sensor location be outside of the immediate volume defined by the DPCV and/or outside of the line-of-sight of the DPCV in order to minimize contamination risks introduced by the presence of the sensor and/or to maximize detection sensitivity. The chamber component selected for return RF current measurement is, in an embodiment, preferably disposed along at least one of the alternative and/or additional return RF current paths formed when the plasma is unconfined. In the plasma unconfinement state, the presence of the alternative and/or additional current paths through this chamber component will induce a voltage in the pick-up coil, which induced voltage can then be processed (after appropriate transformation, amplification and/or filtering if desired) to detect the plasma unconfinement state.

Figure 2:
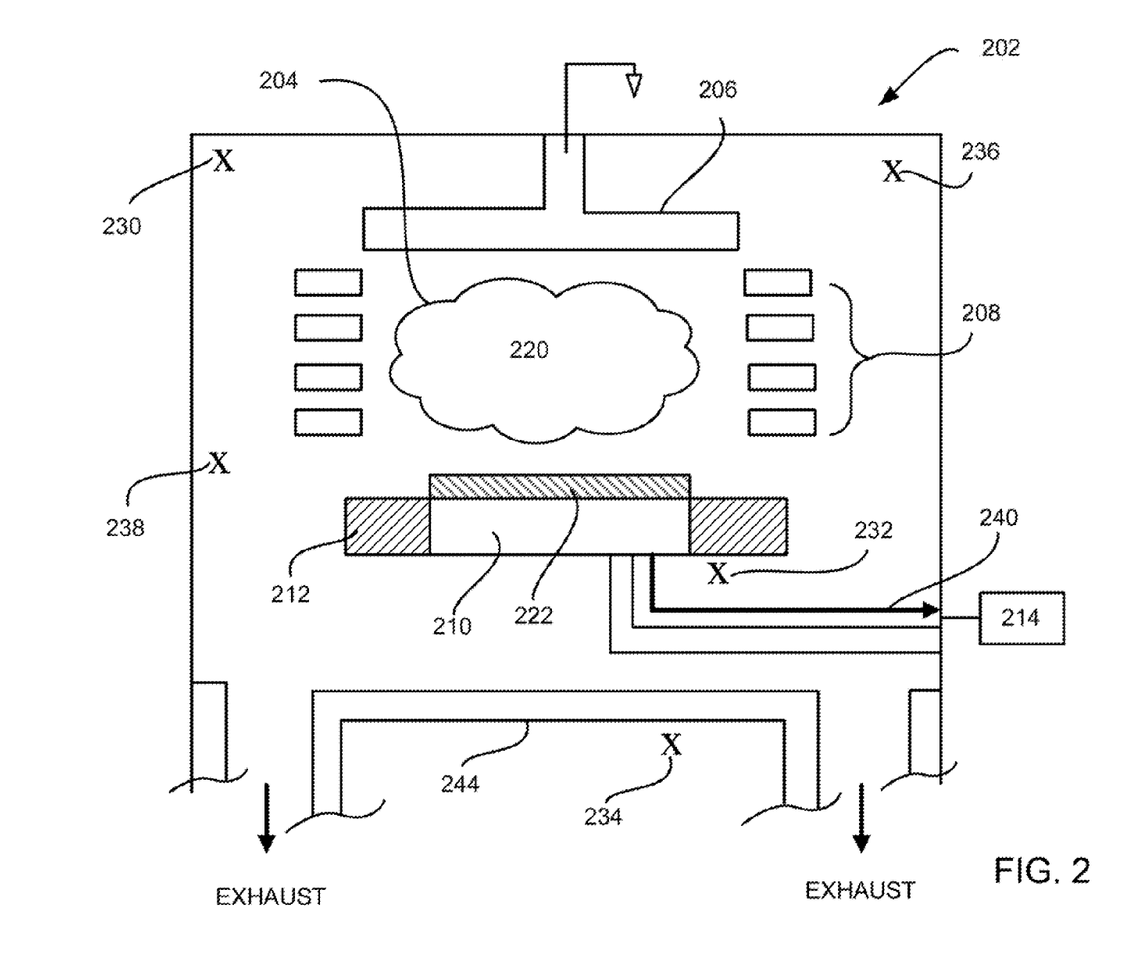
FIG. 2 shows, in accordance with an embodiment of the present invention, a simplified drawing of a capacitively coupled plasma processing chamber, including an implementation of a sensor for a universal plasma unconfinement detection system.

The features and advantages of the invention may be better understood with reference to the figures and discussions that follow. FIG. 2 is a representative and simplified drawing of a capacitively coupled plasma processing chamber to facilitate discussion of embodiments of the invention. It should be noted that embodiments of the invention are not limited to neither the specific configuration of the illustrated plasma processing chamber nor the specific plasma coupling technology employed to generate/sustain the plasma (such as capacitively-coupled, inductively-coupled, microwave, etc.).

With reference to FIG. 2, there is shown a plasma processing chamber 202 having a designed plasma confinement volume (DPCV) 204. In the example of FIG. 2, the DPCV is generally confined within the volume defined by the upper electrode 206, a set of confinement rings 208, and the lower electrode 210/edge ring 212 arrangement. The upper electrode, confinement rings, lower electrode, and edge ring represent respective commercially suitable components currently available in the industry.

In this example, the upper electrode 206 is grounded while the lower electrode 210 is coupled to one or more RF generators in RF generating system 214. RF generating system 214 is configured to provide RF signals having one or more RF frequencies to lower electrode 210 to generate a plasma cloud 220 to process (e.g., etch, strip, deposit, or the like) a wafer 222, which is shown disposed on lower electrode 210.

In the confined state, most or substantially all of the generated plasma is confined within the aforementioned DPCV. Other locations within the chamber but outside the DPCV (marked by reference numbers 230, 232, 234, 236, or 238 for example) experience very low or substantially zero plasma density when the plasma is in the confined state. In the confined state, the return RF current follows established confined state return RF current paths, one of which exists at the surface of the transmission line bore in the example of FIG. 2 and is shown by reference number 240. Note that the exact current path is not the central feature of the present invention since different chamber designs may employ different components and/or different component arrangements, resulting in different confined state return RF current paths. The salient point is that there are established return RF current paths in the confined state.

When the plasma is unconfined, plasma exists outside of the DPCV. The unconfined plasma result in the creation of additional or alternative return RF current paths through which a portion of the return RF current now follows. In some cases, the unconfined state return RF current paths traverses component parts that, in the normal confined state, experiences very little or substantially no return RF current flow.

A sensor may then be employed to detect the change in the return RF current level through the affected chamber part. In an embodiment, a pickup coil is employed as the sensor and is positioned proximate the chamber part where the unconfined state return RF current now flows. The higher return RF current in the unconfined state induces a higher voltage through the coil. By measuring the magnitude of the induced voltage in the coil, it is possible to employ the sensor output to discriminate between the confined state and the unconfined state based on value of the induced voltage provided by the sensing coil. The discrimination task may be performed using, in an embodiment, a programmable computing device or by appropriate dedicated circuitry.

Sensor location 234 is chosen to be proximate chamber component 244. To prevent chamber contamination and/or to minimize plasma-related damage to the sensor, the sensor may be shielded from confined and/or unconfined plasma (e.g., behind a chamber structure or another structure provided for sensor shielding that does not unduly interfere with the ability of the sensor to sense the change in the return RF current level between the confined state and the unconfined state).

Furthermore, sensor location 234 is preferably selected to be a location that yields very low or substantially no induced voltage in the sensor coil during the confined state. On the other hand, location 234 is also selected to be a location that yields, in the unconfined state, a discriminably higher induced voltage in the sensor coil. The distinct change in the induced voltage levels between the confined state and the unconfined state may help improve the accuracy and/or reliability with which the plasma unconfinement state is detected.

As mentioned, sensor location 234 is disposed proximate (such as adjacent to but in a non-contacting relationship) a chamber part that experiences a high level of return RF current in the unconfined state. For example, a sensor disposed proximate to a chamber part that serves as the focal point for the return RF currents when the plasma is unconfined would experience a higher induced voltage through its coil in the unconfined state, rendering the task of discriminating between confined state and the unconfined state substantially simpler and/or more accurate. One skilled in the art would appreciate that there may exist many candidate sensor locations in a given plasma processing chamber, some or all of which may be employed. The exact location chosen depends on the design of the specific plasma processing chamber, the capability of the sensor, the capability of the signal processing circuitry and/or algorithm, and the like.

Figure 3:
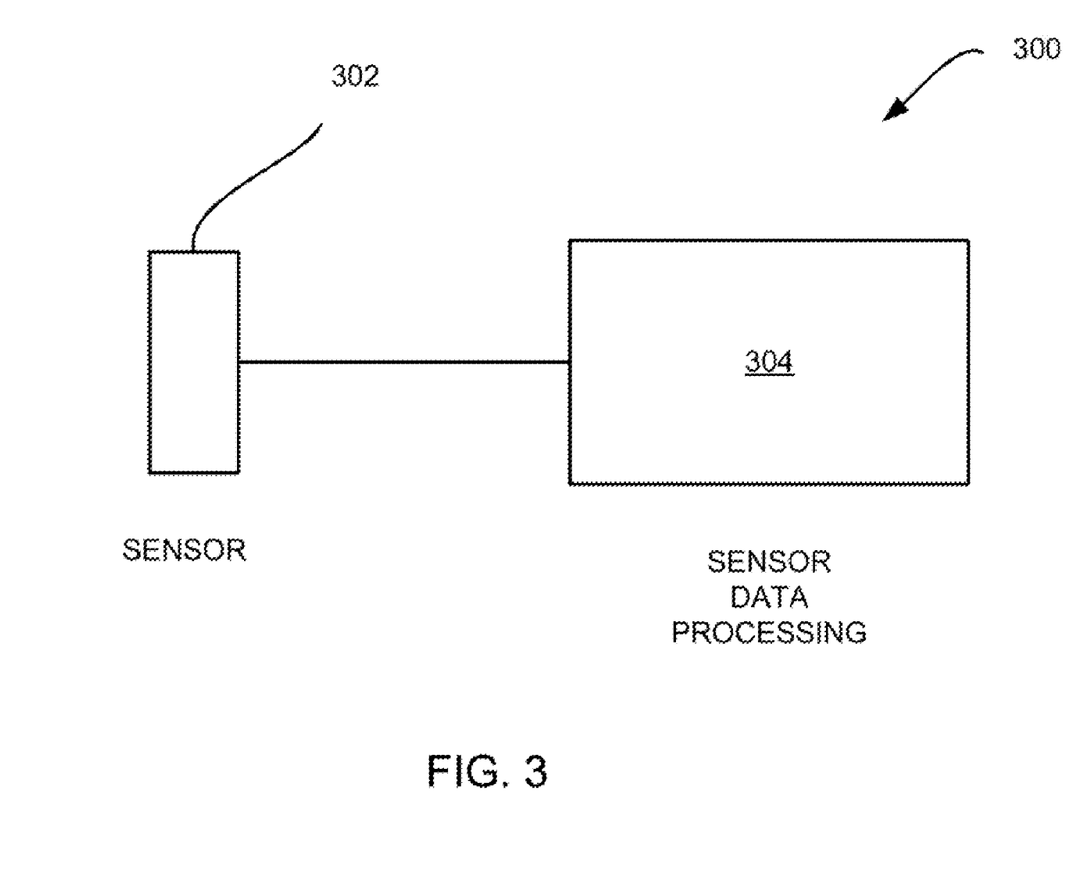
FIG. 3 shows, in accordance with an embodiment of the present invention, an example universal plasma unconfinement detection system, including a sensor and a sensor data processing arrangement.

FIG. 3 shows, in accordance with an embodiment of the present invention, an example universal plasma unconfinement detection system 300 including a sensor 302 and a sensor data processing arrangement 304. Sensor 302 may represent an inductive coil, a capacitive sensor, or an ion sensor. Sensor data processing arrangement 304 includes hardwired and/or programmable circuitry to detect the unconfined state from the sensor signal provided by sensor 302.

Figure 4:
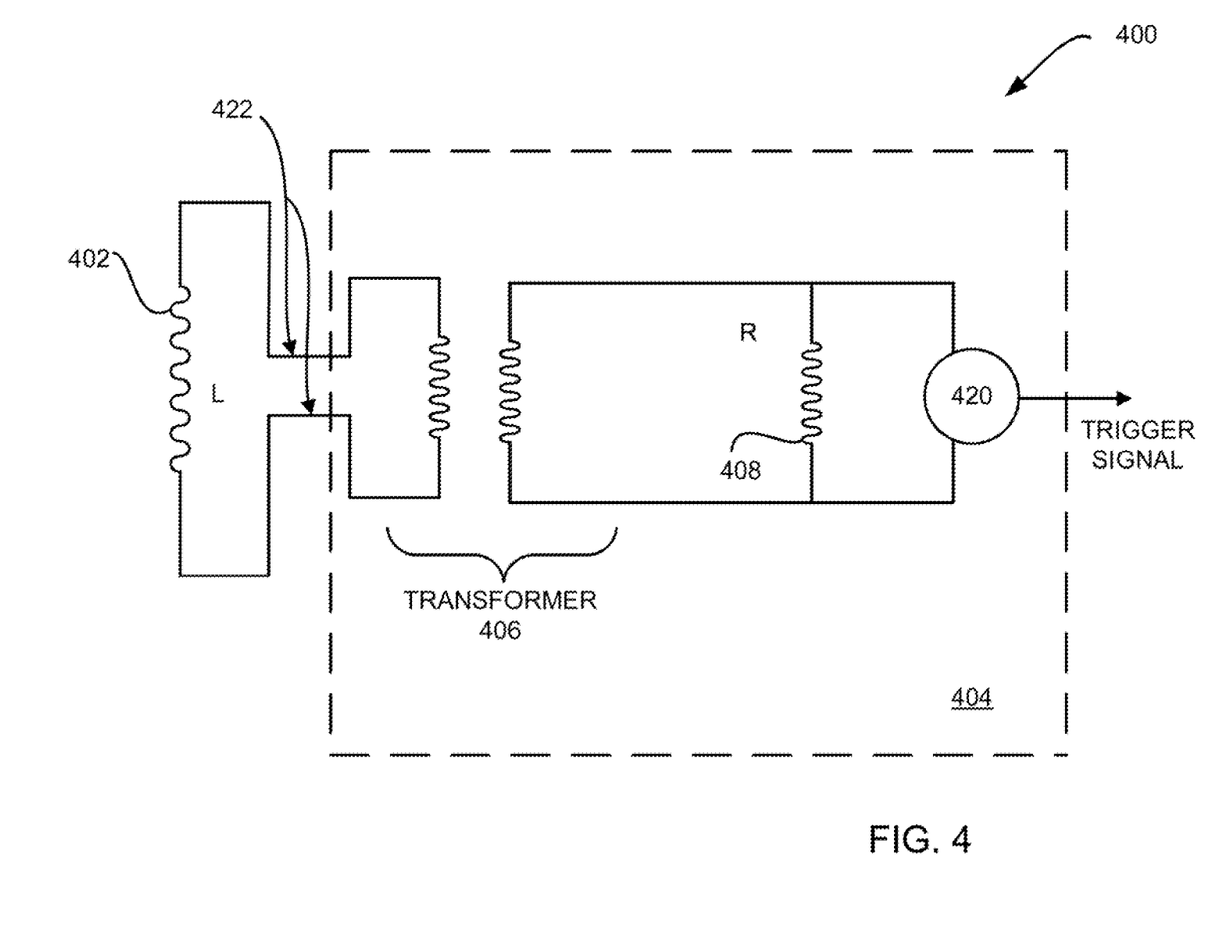
FIG. 4 shows, in accordance with an embodiment of the present invention, an example universal plasma unconfinement detection system, including a sensor/coil and a sensor data processing arrangement that comprises a high frequency transformer, a resistor, and a trigger signal generator.

FIG. 4 shows, in accordance with an embodiment of the present invention, an example universal plasma unconfinement detection system 400 including a sensor/coil 402 and a sensor data processing arrangement 404 comprising a high frequency transformer 406, a resistor 408, and a trigger signal generator 420. The voltage in coil 402 is transmitted to the primary coil of transformer 406 via a suitable conductor path, such as a twisted pair of conductors 422 of FIG. 4. Referring to the example of FIG. 1B, the current pick-up coil is shown by reference number 174, and the twisted pair is shown by reference number 172. Also in FIG. 1, the magnetic field is depicted by reference number 176.

Returning now to FIG. 4, the voltage across the secondary coil of transformer 406 is sensed across resistor 408. In an implementation, the lower electrode of the plasma processing chamber is powered using three separate RF frequencies: 2 MHz, 27 MHz, and 60 MHz. In this example implementation, the inductance of sensor coil 402 is selected to be about 0.3 micro-Henry, and resistor 408 is about 40 ohms. Trigger signal generator 420 is configured to detect the unconfined state from the potential difference across resistor 408, which potential difference reflects the value of the sensor signal from sensor 402.

Figure 5:
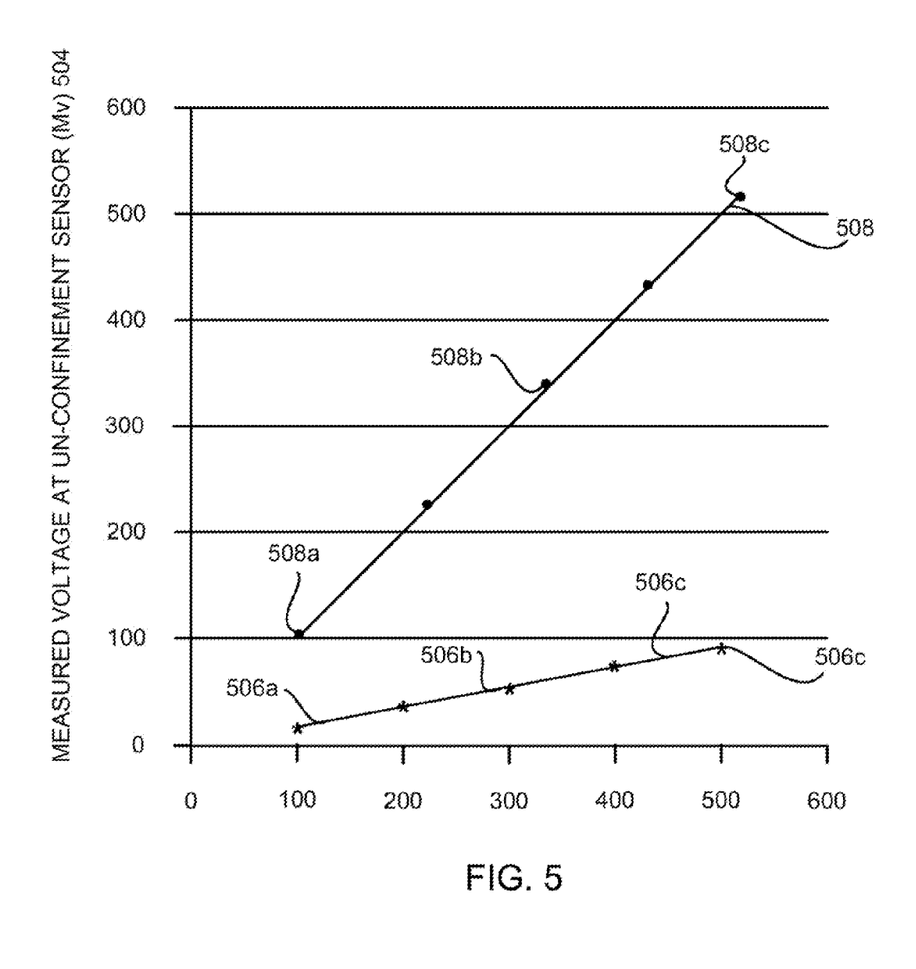
FIG. 5 shows, in accordance with an embodiment of the invention, a plot of the voltage in the sensor coil as a function of the input RF power for the confined state and the unconfined state for an example installation.

FIG. 5 shows, in accordance with an embodiment of the invention, a plot of the voltage in the sensor coil as a function of the input RF power for the confined state (506) and the unconfined state (508) for an example installation. As can be seen in FIG. 5, the difference between the voltage in the sensor coil in the unconfined state (508a) and the voltage in the sensor coil in the confined state (506a) is approximately 80 millivolts at 100 watts of bottom RF power. The relative large magnitude of the difference in these two voltages (508a and 506a) allow the sensor signal processing arrangement to reliably detect the unconfined state. It should be noted that the difference is relatively unchanged as the process recipes vary. Accordingly, embodiments of the invention are deemed by the inventors to be universal and do not require a prior knowledge of the process recipe to detect the unconfined state.

With reference to FIG. 5, the difference in the sensor coil voltages advantageously increase as the bottom RF power level increases. Thus, at 300 watts of bottom RF power, the difference between the voltage in the sensor coil in the unconfined state (508b) and the voltage in the sensor coil in the confined state (506b) is around 280 millivolts. At 500 watts of power, the difference between the voltage in the sensor coil in the unconfined state (508c) and the voltage in the sensor coil in the confined state (506c) is around 510 millivolts. Accordingly, embodiments of the invention are highly suited for detecting the unconfined state in chambers that employ a high process power recipe in order to achieve anisotropic etch profiles and high aspect ratio etches.

Figure 6:
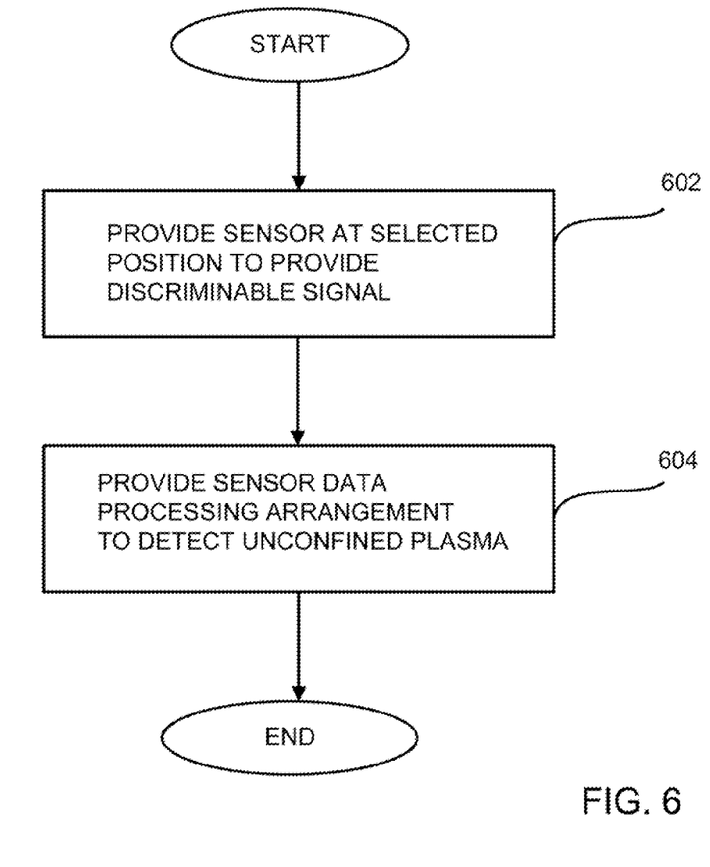
FIG. 6 shows, in accordance with an embodiment of the present invention, the steps for sensing a plasma unconfinement condition in a plasma processing chamber.

FIG. 6 shows, in accordance with an embodiment of the present invention, the steps for sensing a plasma unconfinement condition in a plasma processing chamber. In step 602, a sensor is provided in the chamber at a location selected to enable the sensor to provide a sensor signal with discriminable variation between the plasma confined state and the plasma unconfined state. In step 604, a sensor data processing arrangement is provided to receive the sensor signal and to generate, if a plasma unconfinement condition exists in the chamber, a data signal to signify that the plasma is unconfined.

As can be appreciated from the foregoing, embodiments of the invention render it possible to rapidly and reliably detect the plasma unconfinement state in a plasma processing chamber without having to know in advance the specific process conditions in the chamber. The detection result may then be employed as a trigger signal to address the plasma unconfinement problem, including for example automatically triggering the shutdown of the plasma processing chamber to prevent further damage to the chamber components.

While this invention has been described in terms of several embodiments, there are alterations, permutations, and equivalents, which fall within the scope of this invention. For example, while reference is made to a capacitively-coupled plasma processing chamber in the illustrations herein, embodiments of the invention may also be practiced in other types of plasma processing chambers, including for example inductively coupled plasma processing chambers and microwave-coupled plasma processing chambers. Further, while the illustrated example employs a pickup coil to detect the increase in the return RF current in certain parts of the chamber in order to ascertain whether the plasma unconfinement state exists, other types of sensors may also be employed. For example, a capacitive sensor may well be employed. In an embodiment, a capacitor may be mounted on a via arm, with one of two plates closely tied to ground (using the via arm, for example). The other capacitor plate is exposed in a space that is outside of the designed plasma confinement volume (DPCV) but is known to sustain plasma in the unconfined state. A high-impedance resistor may be provided to avoid charge-up in the confined state. Once unconfinement occurs, the plasma provides charge on the exposed plate, thereby changing the voltage across the capacitor. This change in voltage across the capacitor plates may then be detected by an external detection circuit which is connected to the capacitor plates. As an alternative, an ion density detector may also be employed to detect the increased presence of plasma in certain parts of the chamber during the plasma unconfinement state. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for detecting a plasma unconfinement condition in a plasma processing chamber, said plasma unconfinement condition being characterized by the presence of plasma in excess of a pre-defined specification outside of a designed plasma confinement volume within said plasma processing chamber, the method comprising:

defining said designed plasma confinement volume;

selecting a plasma processing chamber component, said plasma processing chamber component conducting no return RF current during plasma processing if said plasma is confined within said pre-defined specification within said designed plasma confinement volume, said plasma being confined within said pre-defined specification within said designed confinement volume if plasma density in one or more locations outside said designed confinement volume does not exceed a threshold, said plasma processing chamber component conducting a detectable return RF current during said plasma processing if said plasma is in excess of said pre-defined specification outside said designed plasma confinement volume during said plasma processing, said plasma being in excess of said pre-defined specification outside said designed confinement volume if said plasma density in said one or more locations outside said designed confinement volume exceeds said threshold;

providing a sensor for performing current detection related to said plasma processing chamber component by disposing said sensor in a selected position such that said sensor does not contact said plasma processing chamber component, wherein said sensor and said selected position are configured to provide an electrical parameter having discriminable variation between a first state and a second state, said first state being characteristic of absence of said detectable return RF current in said plasma processing chamber component, said second state being characteristic of presence of said detectable return RF current conducted through said plasma processing chamber component; and providing a sensor data processing arrangement that is coupled to said sensor, said sensor data processing arrangement being configured to provide, responsive to said electrical parameter, a data signal signifying whether said plasma processing chamber is experiencing said plasma unconfinement condition.

2. The method of claim 1 wherein said selected position is outside said designed plasma confinement volume.

3. The method of claim 2 wherein said selected position is adjacent to said plasma processing chamber component.

4. The method of claim 1 wherein said sensor is a current-sensing coil.

5. The method of claim 1 wherein said sensor data arrangement further includes
   circuitry configured to generate a discriminable potential difference from said electrical parameter, and
   software-controlled signal generator for generating said data signal from said potential difference.

6. The method of claim 5 wherein said circuitry includes at least one of a transformer and a resistor.

7. The method of claim 6 wherein said selected position is outside of said designed plasma confinement volume.

8. The method of claim 6 wherein said selected position represents a position that is not direct line-of-sight with respect to said designed plasma confinement volume.

9. The method of claim 1 wherein said plasma processing chamber represents a capacitively coupled plasma processing chamber.

10. The method of claim 1 wherein said plasma processing chamber represents an inductively coupled plasma processing chamber.

11. The method of claim 1 wherein said plasma processing chamber includes a first electrode, a second electrode, and a set of confinement rings, said designed plasma confinement volume being defined by said first electrode, said second electrode, and said set of confinement rings.

12. A plasma processing system including a plasma processing chamber and an apparatus for detecting a plasma unconfinement condition in said plasma processing chamber, said plasma unconfinement condition being characterized by the presence of plasma in excess of a pre-defined specification outside of a designed plasma confinement volume within said plasma processing chamber, the plasma processing system comprising:

a plasma processing chamber component, said plasma processing chamber component conducting no return RF current during plasma processing if said plasma is confined within said pre-defined specification within said designed plasma confinement volume, said plasma being confined within said pre-defined specification within said designed confinement volume if plasma density in one or more locations outside said designed confinement volume does not exceed a threshold, said plasma processing chamber component conducting detectable return RF current during said plasma processing if said plasma is in excess of said pre-defined specification outside said designed plasma confinement volume during said plasma processing, said plasma being in excess of said pre-defined specification outside said designed confinement volume if said plasma density in said one or more locations outside said designed confinement volume exceeds said threshold;

a sensor for performing current detection related to said plasma processing chamber component, said sensor being disposed in a selected position such that said sensor does not contact said plasma processing chamber component, wherein said sensor and said selected position are configured to provide an electrical parameter having discriminable variation between a first state and a second state, said first state being characteristic of absence of said detectable return RF current in said plasma processing chamber component, said second state being characteristic of presence of said detectable return RF current conducted through said plasma processing chamber component; and a sensor data processing arrangement coupled to said sensor, said sensor data processing arrangement being configured to provide, responsive to said electrical parameter, a data signal signifying whether said plasma processing chamber is experiencing said plasma unconfinement condition.

13. The plasma processing system of claim 12 wherein said selected position is outside said designed plasma confinement volume.

14. The plasma processing system of claim 13 wherein said selected position is adjacent to said plasma processing chamber component.

15. The plasma processing system of claim 12 wherein said sensor is a current-sensing coil.

16. The plasma processing system of claim 12 wherein said sensor data arrangement further includes
   circuitry configured to generate a discriminable potential difference from said electrical parameter, and
   software-controlled signal generator for generating said data signal from said potential difference.

17. The plasma processing system of claim 16 wherein said circuitry includes at least one of a transformer and a resistor.

18. The plasma processing system of claim 17 wherein said selected position is outside of said designed plasma confinement volume.

19. The plasma processing system of claim 17 wherein said selected position represents a position that is not direct line-of-sight with respect to said designed plasma confinement volume.

20. The plasma processing system of claim 12 wherein said plasma processing chamber represents a capacitively coupled plasma processing chamber.

21. The plasma processing system of claim 12 wherein said plasma processing chamber represents an inductively coupled plasma processing chamber.

22. The plasma processing system of claim 12 further comprising a first electrode, a second electrode, and a set of confinement rings, said designed plasma confinement volume being defined by said first electrode, said second electrode, and said set of confinement rings.

* * * * *